United States Patent
Yen et al.

(10) Patent No.: US 10,541,512 B2
(45) Date of Patent: Jan. 21, 2020

(54) SURFACE EMITTING LASER LUMINESCENT DIODE STRUCTURE

(71) Applicant: HIGH POWER OPTO. INC., Taichung (TW)

(72) Inventors: Wei-Yu Yen, Taichung (TW); Li-Ping Chou, Taichung (TW); Tau-Jin Wu, Taichung (TW); Chih-Sung Chang, Taichung (TW)

(73) Assignee: High Power Opto. Inc., Taichung (TW)

( * ) Notice: Subject to any disclaimer, the term of this patent is extended or adjusted under 35 U.S.C. 154(b) by 0 days.

(21) Appl. No.: 16/299,780

(22) Filed: Mar. 12, 2019

(65) Prior Publication Data

US 2019/0334319 A1 Oct. 31, 2019

(30) Foreign Application Priority Data

Apr. 30, 2018 (TW) .............................. 107114690 A

(51) Int. Cl.
*H01S 5/183* (2006.01)

(52) U.S. Cl.
CPC ...... *H01S 5/18361* (2013.01); *H01S 5/18308* (2013.01); *H01S 5/18322* (2013.01); *H01S 5/18341* (2013.01); *H01S 5/18344* (2013.01); *H01S 5/18352* (2013.01); *H01S 5/18369* (2013.01); *H01S 5/18394* (2013.01)

(58) Field of Classification Search
CPC ............. H01S 5/18361; H01S 5/18344; H01S 5/18322; H01S 5/18394; H01S 5/18369; H01S 5/18352; H01S 5/18308; H01S 5/18341

See application file for complete search history.

(56) References Cited

U.S. PATENT DOCUMENTS

| | | | |
|---|---|---|---|
| 2015/0043606 A1* | 2/2015 | Hamaguchi | H01S 5/0425 372/50.11 |
| 2017/0201073 A1* | 7/2017 | Futagawa | H01S 5/18361 |
| 2017/0373468 A1* | 12/2017 | Izumi | H01S 5/183 |

FOREIGN PATENT DOCUMENTS

| | | | | |
|---|---|---|---|---|
| JP | 585771 A | * | 4/1983 | ........... H01S 5/2275 |
| TW | I268031 | | 12/2006 | |
| TW | 200705761 A | | 2/2007 | |
| TW | I403050 | | 7/2013 | |

* cited by examiner

*Primary Examiner* — Yuanda Zhang
(74) *Attorney, Agent, or Firm* — Muncy, Geissler, Olds & Lowe, P.C.

(57) ABSTRACT

The present invention is a surface emitting laser luminescent diode structure which is characterized in that a recess comprises two tilted slopes on two sides and a protruding trapezoidal cylinder located at the bottom center of the recess is disposed at the bottom of a laser resonant cavity. Thus, a reflecting mirror disposed along the surface of the recess includes two tilted side surfaces as leak-proof sides, which reduces the divergence angle and avoid the lateral light leakage. Additionally, a current isolating layer is disposed on the reflecting mirror and is designed to satisfy the condition (¼*wavelength*1/refractive index) of an optical film, thereby allowing the reflecting mirror to receive an excellent reflectance. Besides, the current isolating layer limits the flow direction of the current, thus increasing operating speed.

7 Claims, 5 Drawing Sheets

SURFACE EMITTING LASER LUMINESCENT DIODE STRUCTURE

FIELD OF THE INVENTION

The present invention relates to a surface emitting laser luminescent diode, and more particularly to a structure of the surface emitting laser luminescent diode structure.

BACKGROUND OF THE INVENTION

Surface Emitting Laser (SEL) is a semiconductor structure of which laser is emitted perpendicularly to a top surface, for example, the Taiwan patent No. I268031 entitled "Vertical Cavity Surface Emitting Laser and Method for Fabricating the Same" and the Taiwan patent No. I403050 entitled "Vertical Cavity Surface Emitting Laser (VCSEL), VCSEL Array Device, Optical Scanning Apparatus, and Image Forming Apparatus".

Referring to FIG. 1, a traditional surface emitting laser structure includes a P-type electrode 1, a substrate 2, a bonding layer 3, a stress release layer 4, an impressed current distribution layer 5, a lower reflecting layer 6, a passivation layer 7, a luminescent diode layer 8, an upper reflecting layer 9, a band-pass layer 10, and an N-type electrode 11. The lower reflecting layer 6 and the upper reflecting layer 9 are made of high-reflectance materials (optimal value: a reflectance of 100%) to form a resonant cavity. The band-pass layer 10 is capable of reflecting incident light with a wavelength in a particular range, allows the incident light with the wavelength in the particular range to pass therethrough, and includes a reflectance of 90-99% and a penetration of 1-10%. Since the wavelength of most electroluminescence generated by the luminescent diode 8 is not in the particular range, most of the electroluminescence is reflected repeatedly between the lower reflecting layer 6 and the upper reflecting layer 9 and keeps emitting on the luminescent diode 8. Then, the electroluminescence resonates with the luminescent diode 8 to generate new electroluminescence. However, only a small portion of electroluminescence generated by the luminescent diode 8 has a wavelength in the particular range and is able to emit through the band-pass layer 10.

In such a traditional surface emitting laser structure, the passivation layer 7 is only used non-conducting oxidized metals to avoid a short circuit, whereby the light extraction efficiency of the laser reduced since the electroluminescence generated by the luminescent diode 8 would leak from the passivation layer 7. Thus, it is hard to meet the user's requirement on the reflectance. Accordingly, it needs to set a larger size of the luminescent diode 8 for the poor light extraction efficiency; however it further causes the response time increased. Besides, the impressed current distribution layer 5 also needs to be a large area in order to control a flow direction of the current, thereby the effective area of the lower reflecting layer 6 is hard to increase and fails to form a favorable resonant cavity accordingly. In addition, such a traditional structure design does not generate a real vertical light source, and signals are prone to significant attenuation due to the long-distance transmission, thereby failing to satisfy the user's needs.

SUMMARY OF THE INVENTION

In view of the above problems, a major objective of the present invention is to provide a surface emitting laser luminescent diode structure with a small divergence angle of light and a high operating speed.

The present invention relates to a surface emitting laser luminescent diode structure including a thermal conductivity insulating substrate, a bonding layer, a protective layer, a reflecting mirror, a current isolating layer, a P-type semiconductor, a luminescent diode, an N-type semiconductor, an upper reflecting layer, a P-type electrode, an N-type electrode, and a band-pass layer.

The bonding layer is disposed on the thermal conductivity insulating substrate and comprises a recess. The recess comprises two tilted slopes on two sides, and a trapezoidal cylinder located and protruding from a bottom center of the recess, wherein a basal area of the trapezoidal cylinder is smaller than a basal area of the recess. The protective layer is electrically conductive and is disposed on the bonding layer along the surface of the recess, and defines an electrode region and a laser cavity region, wherein the recess is located in the laser cavity region. The reflecting mirror is electrically conductive and is disposed on the protective layer along the surface of the recess, and completely covers the laser cavity region. The current isolating layer is disposed on the reflecting mirror along the surface of the recess to form a recessed space and the reflecting mirror is exposed at a position thereof corresponding to the trapezoidal cylinder. Moreover, a bottom of the recessed space and the exposed part of the reflecting mirror are at a same height to form a flat bottom surface.

The P-type semiconductor is disposed on the flat bottom surface and in electrical contact with the reflecting mirror. The luminescent diode is disposed on the P-type semiconductor and located within the recessed space. The N-type semiconductor is disposed on the luminescent diode and fills the recessed space. The upper reflecting layer completely covers the N-type semiconductor and comprises a band-pass opening and an electrode opening. The P-type electrode is disposed on the protective layer in electrical connection with the electrode region. The N-type electrode is disposed in the electrode opening and electrically connected to the N-type semiconductor. Additionally, the band-pass layer is disposed on the band-pass opening 801 and allows light having a wavelength in a particular range to pass therethrough and has a reflectance of 90-99% and a penetration of 1-10%.

As described above, the light excited by the luminescent diode is reflected repeatedly between the band-pass layer and the reflecting mirror to resonate, that is, a resonant cavity is formed between the band-pass layer and the reflecting mirror to allow light having a wavelength in a particular range to be emitted from the band-pass layer to form laser light.

Therefore, the reflecting mirror is disposed on the protective layer along the surface of the recess and completely covers the laser cavity region according to the present invention, thus forming a reflecting structure comprising two tilted side surfaces as leak-proof sides, where a divergence angle of the light is reduced and lateral light leakage is avoided since the reflecting structure comprising the two tilted side surfaces is capable of reflecting light toward the band-pass layer.

In addition, the current isolating layer is disposed on the reflecting mirror along the surface of the recess, and imparts an excellent reflectance to the reflecting mirror when designed to satisfy the condition (¼*wavelength*1/refractive index) of an optical film. Besides, the current isolating layer limits a flow direction of the current, thus increasing a response speed.

DETAILED DESCRIPTION OF THE PREFERRED EMBODIMENTS

The detailed description and technical content of the present invention will now be described with reference to the accompanying drawings as follows.

Figure 1:
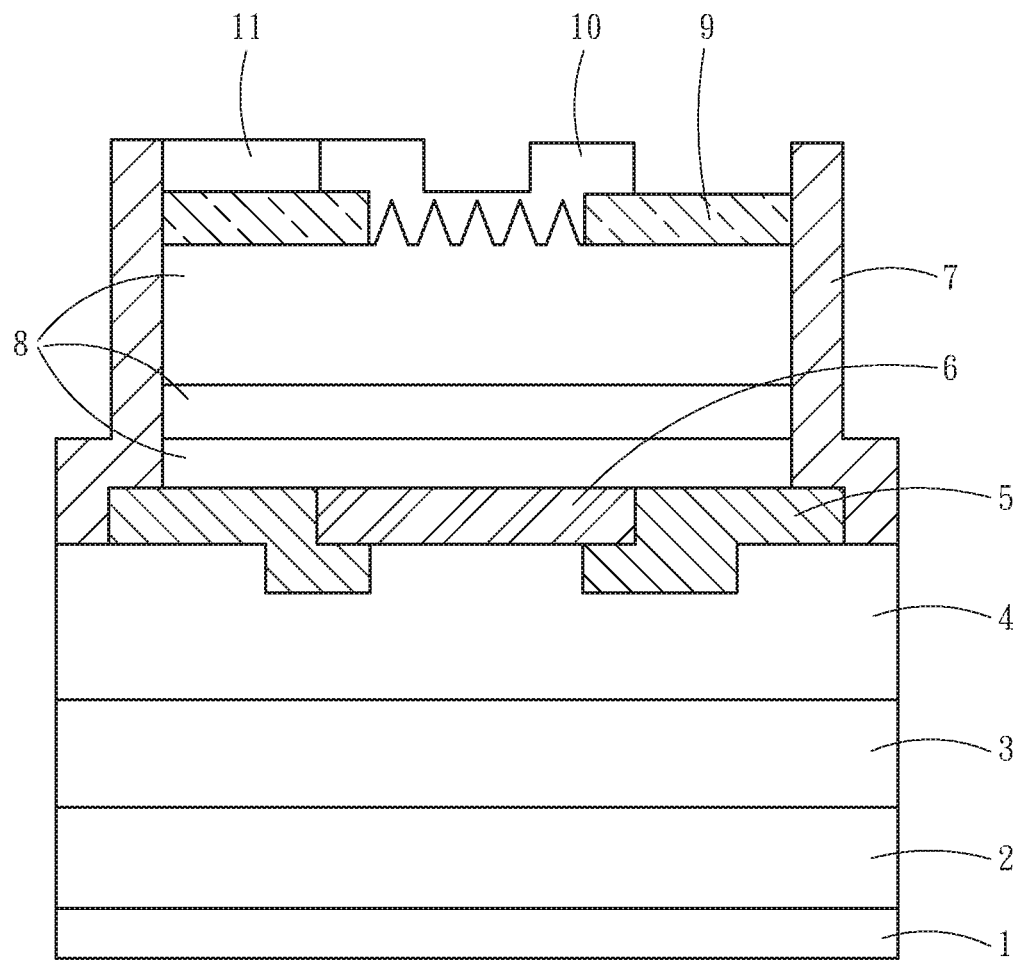
FIG. 1 is a structure diagram of a surface emitting laser luminescent diode of the prior art.
Figure 2:
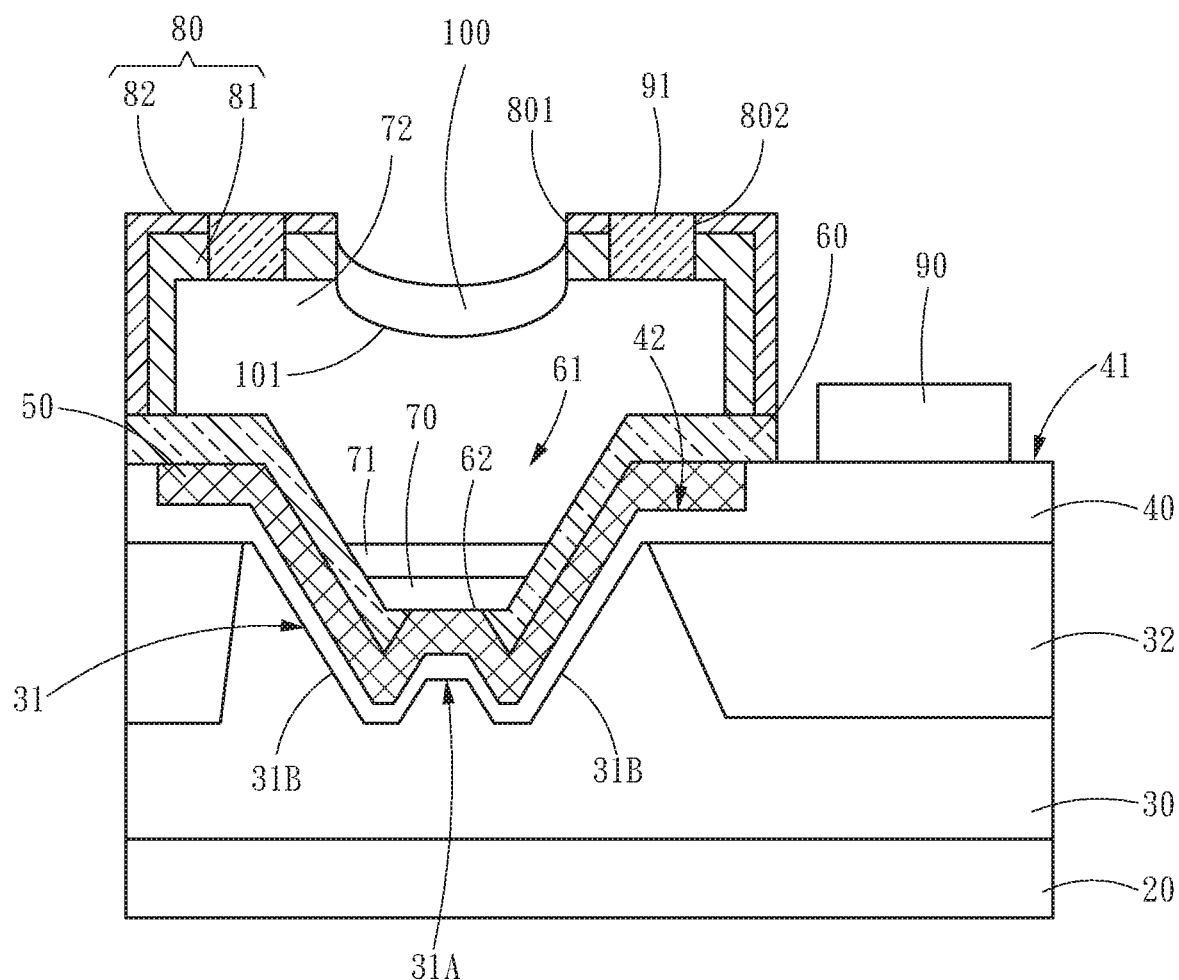
FIG. 2 is a structure diagram of a surface emitting laser luminescent diode of the present invention.
Figure 3:
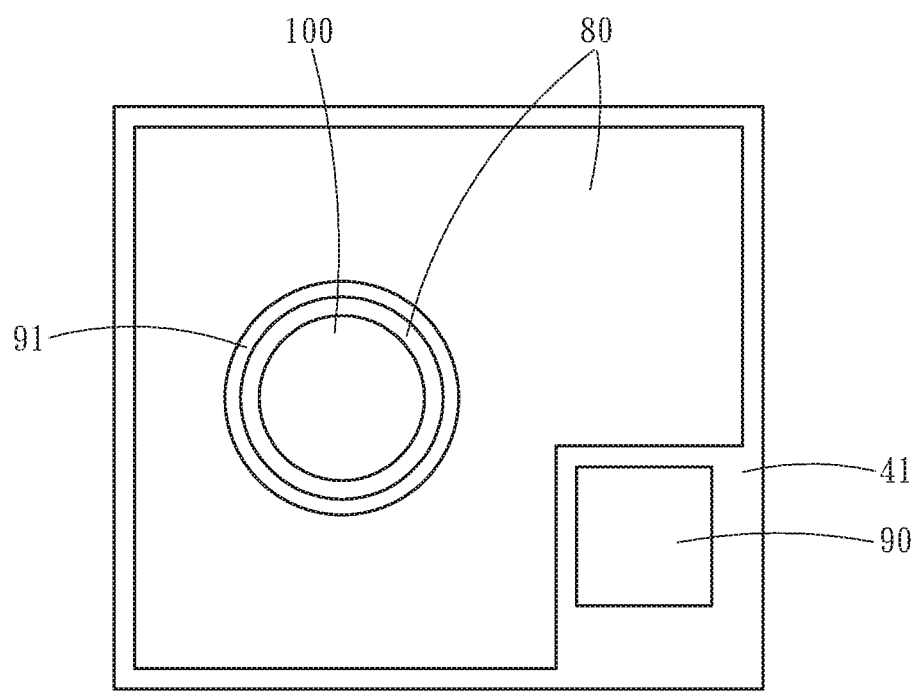
FIG. 3 is a top view of a surface emitting laser luminescent diode structure of the present invention.

Referring to FIG. 2 and FIG. 3, the present invention relates to a surface emitting laser luminescent diode structure including a thermal conductivity insulating substrate 20, a bonding layer 30, a protective layer 40, a reflecting mirror 50, a current isolating layer 60, a P-type semiconductor 70, a luminescent diode 71, an N-type semiconductor 72, an upper reflecting layer 80, a P-type electrode 90, an N-type electrode 91, and a band-pass layer 100.

In one embodiment, the bonding layer 30 is disposed on the thermal conductivity insulating substrate 20 and comprises a recess 31. The recess 31 comprises two tilted slopes 31B on two sides, and a trapezoidal cylinder 31A located and protruding from a bottom center of the recess 31. A basal area of the trapezoidal cylinder 31A is smaller than a basal area of the recess 31. In addition, an elevation angle of each of the two tilted slopes 31B is preferably ranged from 30 to 45 degrees. The bonding layer 30 is made of a material selected from In or Ti/Au.

The protective layer 40 with electrically conductivity is disposed on the bonding layer 30 along a surface of the recess 31, and the protective layer 40 defines an electrode region 41 and a laser cavity region 42. The recess 31 is located in the laser cavity region 42. The protective layer 40 is made of a material selected from TiW/Pt/TiW/Pt or Ti/Pt. In addition, a stress release layer 32 is further disposed between the protective layer 40 and the bonding layer 30 in the electrode region 41 to release the residual stress generated during the thin-film processing, whereby the breaking stress is reduced and the problem of film peeling, film wrinkling, and lattice mismatch are avoided. The stress release layer 32 is made of a material selected from Ti/Au or Ni.

The reflecting mirror 50 with electrically conductivity is disposed on the protective layer 40 along the surface of the recess 31, and completely covers the laser cavity region 42. The reflecting mirror 50 is made of a material selected from Ag/TiW/Pt or Ag/Ni.

The current isolating layer 60 is disposed on the reflecting mirror 50 along the surface of the recess 31 to form a recessed space 61 and the reflecting mirror 50 is exposed at a position thereof corresponding to the trapezoidal cylinder 31A. Moreover, a bottom of the recessed space 61 of the current isolating layer 60 and the exposed part of the reflecting mirror 50 are at a same height to form a flat bottom surface 62. The current isolating layer 60 is made of a material selected from $Ta_2O_3$, $SiO_2$ or $TiO_2$. Further, the current isolating layer 60 disposed on the reflecting mirror 50 is designed to satisfy the condition (¼*wavelength*1/refractive index) of an optical film, so that the reflecting mirror 50 has an excellent reflectance. Besides, the current isolating layer 60 is capable of limiting the flow direction of the current, thus the reacting speed could be improved to increase the reacting a response speed.

The P-type semiconductor 70 is disposed on the flat bottom surface 62 and in electrical contact with the reflecting mirror 50.

The luminescent diode 71 is disposed on the P-type semiconductor 70 and located within the recessed space 61. The N-type semiconductor 72 is disposed on the luminescent diode 71 and fills the recessed space 61.

The upper reflecting layer 80 completely covers the N-type semiconductor 72 and comprises a band-pass opening 801 and an electrode opening 802. The upper reflecting layer 80 preferably has a reflectance of 100%. In this embodiment, the upper reflecting layer 80 includes a Bragg reflecting layer 81 located inside and a metal shielding layer 82 located outside. The upper reflecting layer 80 is imparted with a reflectance of approximately 100% by designing the Bragg reflecting layer 81 to satisfy a condition (¼*wavelength*1/refractive index) of an optical film. The Bragg reflecting layer 81 is a multilayer structure and made of a material selected from $Ta_2O_3/SiO_2$ or $TiO_2/SiO_2$.

The P-type electrode 90 is disposed on the protective layer 40 in electrical connection with the electrode region 41. The N-type electrode 91 is disposed in the electrode opening 802 and electrically connected to the N-type semiconductor 72.

The band-pass layer 100 is disposed on the band-pass opening 801 and allows a light with a wavelength in a particular range to pass through and the band-pass layer 100 has a reflectance of 90-99% and a penetration of 1-10%. The N-type electrode 91 is located around the band-pass layer 100 to provide a uniform current. Further, the band-pass layer 100 comprises a Bragg reflecting structure designed as a multilayer. The band-pass layer 100 is made of a material selected from $Ta_2O_3/SiO_2$ or $TiO_2/SiO_2$. Moreover, the band-pass layer 100 is further to be an arc-shaped light-focusing structure 101 to focus the light and reduce the divergence angle thereof.

Figure 4:
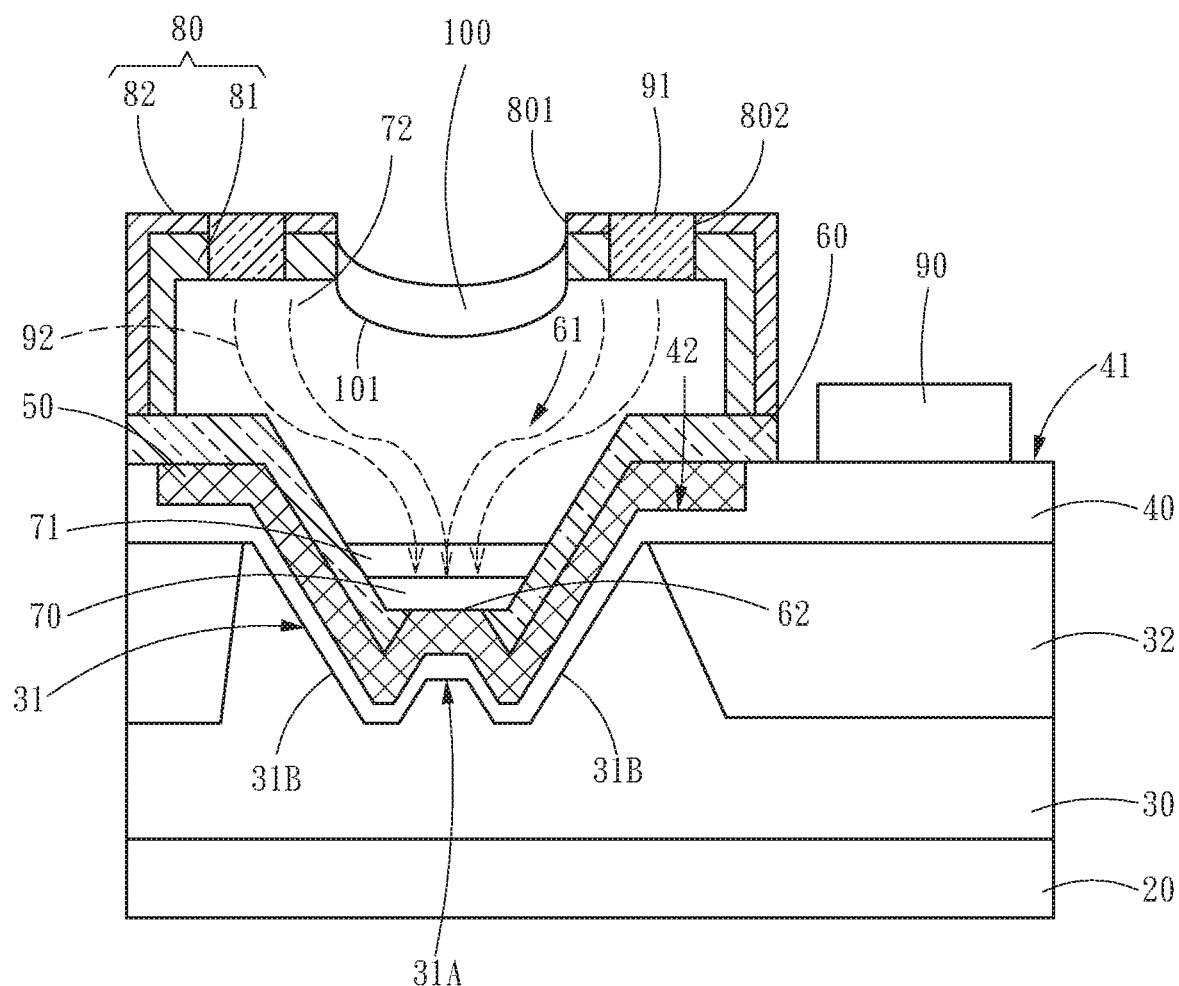
FIG. 4 is a schematic current diagram of a surface emitting laser luminescent diode of the present invention.
Figure 5:
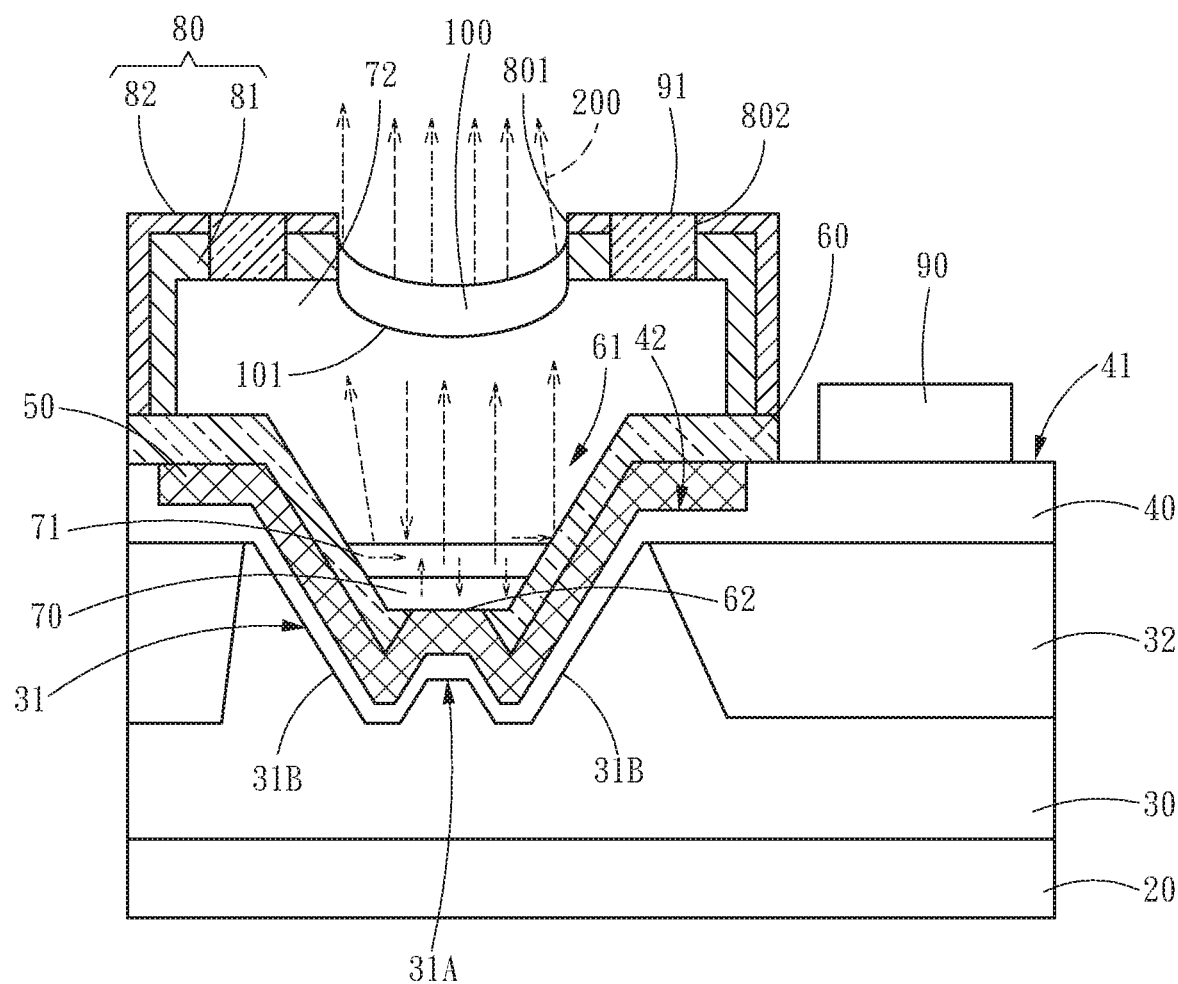
FIG. 5 is a schematic light-exiting diagram of a surface emitting laser luminescent diode of the present invention.

Referring to FIG. 4 and FIG. 5, when a forward bias voltage is supplied between the P-type electrode 90 and the N-type electrode 91, a current 92 is blocked by the current isolating layer 60 and ejected to the luminescent diode 71 instead, and therefore, the luminescent diode 71 is excited to generate a light 200. After generated by the luminescent diode 71, the light 200 is further emitted in all directions, where the light 200 emitted downwards and the light 200 emitted laterally are both reflected by the reflecting mirror 50 and guided to the band-pass layer 100. Since the band-pass layer 100 allows a light with a wavelength in a particular range to pass therethrough and has a reflectance of 90-99% and a penetration of 1-10%, most of the light 200 is reflected and emits to the luminescent diode 71. Then, most of the light 200 resonates with the luminescent diode 7 1 and the luminescent diode 71 is re-excited to regenerate light 200. Only the light 200 with a wavelength in the particular range can be emitted through the band-pass layer 100.

Therefore, the present invention includes at least the following advantages:

1. According to the present invention, the reflecting mirror is disposed on the protective layer along the surface of the recess and completely covers the laser cavity region, such that a resonant cavity is formed to increase the operation speed and to narrow the wavelength distribution.

2. The reflecting mirror is disposed along the surface of the recess, so that the reflecting mirror includes two tilted side surfaces as leak-proof sides, which reduce the literal light leakage on two side surfaces of the reflecting structure and allow the reflecting light passing through the band-pass layer to reduce the divergence angle.

3. The current isolating layer is disposed on the reflecting mirror along the surface of the recess, and the reflecting mirror is designed to satisfy the condition (¼*wavelength*1/refractive index) of an optical film, so that the reflecting mirror has an excellent reflectance.

4. The current isolating layer is capable of limiting the flow direction of the current, thus increasing a response speed.

5. The band-pass layer is further to be an arc-shaped light-focusing structure and thus is capable of further focusing light and reducing the divergence angle thereof

What is claimed is:

1. A surface emitting laser luminescent diode structure, comprising:
  a thermal conductivity insulating substrate;
  a bonding layer, disposed on the thermal conductivity insulating substrate and comprising a recess, the recess including two tilted slopes on two sides, and a trapezoidal cylinder located and protruding from a bottom center of the recess, wherein a basal area of the trapezoidal cylinder is smaller than a basal area of the recess;
  a protective layer, with electrically conductivity, disposed on the bonding layer along a surface of the recess, and the protective layer defining an electrode region and a laser cavity region, wherein the recess is located in the laser cavity region;
  a reflecting mirror, with electrically conductivity, disposed on the protective layer along the surface of the recess and completely covering the laser cavity region;
  a current isolating layer, disposed on the reflecting mirror along the surface of the recess to form a recessed space and a exposed part of the reflecting mirror, which is corresponding to the trapezoidal cylinder, wherein a bottom of the recessed space and the exposed part of the reflecting mirror are at a same height to form a flat bottom surface;
  a P-type semiconductor, disposed on the flat bottom surface and in electrical contact with the reflecting mirror;
  a luminescent diode, disposed on the P-type semiconductor and located within the recessed space;
  an N-type semiconductor, disposed on the luminescent diode and filling the recessed space;
  an upper reflecting layer, completely covering the N-type semiconductor and comprising a band-pass opening and an electrode opening;
  a P-type electrode, disposed on the protective layer in electrical connection with the electrode region;
  an N-type electrode, disposed in the electrode opening and electrically connected to the N-type semiconductor; and
  a band-pass layer, disposed on the band-pass opening and allowing a light with a wavelength in a particular range to pass through and including a reflectance of 90-99% and a penetration of 1-10%.

2. The surface emitting laser luminescent diode structure according to claim 1, wherein a stress release layer is further disposed between the protective layer and the bonding layer in the electrode region.

3. The surface emitting laser luminescent diode structure according to claim 1, wherein an elevation angle of each of the two tilted slopes is ranged from 30 to 45 degrees.

4. The surface emitting laser luminescent diode structure according to claim 1, wherein the upper reflecting layer includes a Bragg reflecting layer located inside and a metal shielding layer located outside.

5. The surface emitting laser luminescent diode structure according to claim 1, wherein the band-pass layer is a Bragg reflecting structure.

6. The surface emitting laser luminescent diode structure according to claim 1, wherein the band-pass layer is an arc-shaped light-focusing structure.

7. The surface emitting laser luminescent diode structure according to claim 1, wherein the N-type electrode is located around the band-pass layer.

* * * * *